United States Patent

Kerchaert et al.

Patent Number: 5,530,360
Date of Patent: Jun. 25, 1996

[54] APPARATUS AND METHOD FOR DIAGNOSING FAULTS IN A VEHICLE ELECTRICAL SYSTEM

[75] Inventors: Robert B. Kerchaert, Linden; Leon Brank, Troy; Neal G. Stupera, Fraser; Douglas G. Glondeniz, Roseville, all of Mich.

[73] Assignee: Chrysler Corporation, Auburn Hills, Mich.

[21] Appl. No.: 352,993

[22] Filed: Dec. 9, 1994

[51] Int. Cl.⁶ ............................ F02P 17/00; G01M 15/00
[52] U.S. Cl. ......................... 324/379; 324/402; 324/503; 324/528; 364/424.04; 73/117.3
[58] Field of Search ........................... 324/503, 522, 324/528, 378, 379, 402; 364/424.03, 424.04, 550, 551.01, 431.11, 431.12; 73/117.2, 117.3

[56] References Cited

U.S. PATENT DOCUMENTS

| | | | |
|---|---|---|---|
| 4,267,569 | 5/1981 | Baumann et al. | 364/424.04 X |
| 4,404,639 | 9/1983 | McGuire et al. | 364/424.04 |
| 4,739,276 | 4/1988 | Graube | 324/534 |
| 5,003,476 | 3/1991 | Abe | 364/424.04 X |
| 5,034,889 | 7/1991 | Abe | 364/424.04 |
| 5,050,080 | 9/1991 | Abe | 364/424.04 |
| 5,066,919 | 11/1991 | Klassen et al. | 324/538 |
| 5,072,391 | 12/1991 | Abe | 364/424.04 |
| 5,214,582 | 5/1993 | Gray | 364/424.03 |
| 5,268,644 | 12/1993 | Klassen et al. | 324/503 |
| 5,318,449 | 6/1994 | Schoell et al. | 364/424.03 X |

OTHER PUBLICATIONS

Huntron Instruments, Inc. User's Manual, Dec. 1991 P/N 21-1119: Tracker 5100DS and Prober RP388.

Primary Examiner—Kenneth A. Wieder
Assistant Examiner—Diep Do
Attorney, Agent, or Firm—Christopher A. Taravella

[57] ABSTRACT

An apparatus for diagnosing the presence and location of faults within a vehicle's electrical system includes a signal generator for generating an a.c. test signal; a switching circuit connected to an interface between the system's ECU and the system's components for selectively and sequentially applying the a.c. test signal into each electrical lead therein; and a first detector connected to the system's common ground for detecting the system's response to the applied signals, thereby obtaining a set of transitory characteristics for the vehicle's electrical system. The apparatus further includes an EPROM within which a set of reference characteristics for the vehicle's electrical system is stored; a comparator means for comparing the detected transitory characteristics with the stored set of reference characteristics; and a diagnostic processor responsive to the comparator means for diagnosing the presence of a fault when the detected transitory characteristics of the vehicle's electrical system deviate significantly from the stored set of reference characteristics therefor. Upon diagnosing the presence of a fault within the vehicle's electrical system, a d.c. test signal is injected under the control of the diagnostic processor using the switching circuit only into the lead or leads of the interface deemed responsible for the deviant system output. A second detector likewise connected by the switching means only to those leads deemed responsible for the deviant system output detects the reflection of the d.c. test signal for use by the diagnostic processor in determining the location of any existing fault relative to the interface.

12 Claims, 1 Drawing Sheet

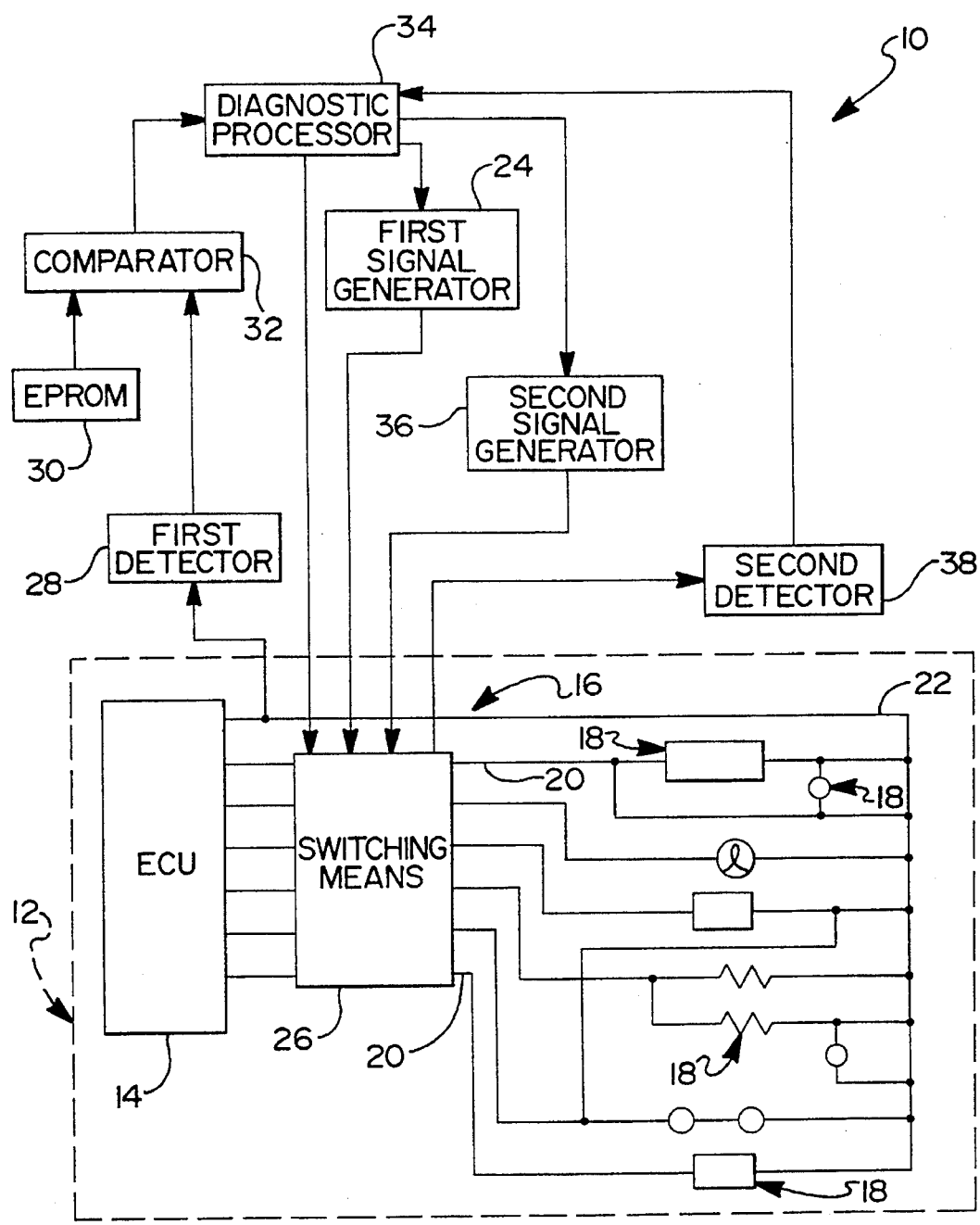

APPARATUS AND METHOD FOR DIAGNOSING FAULTS IN A VEHICLE ELECTRICAL SYSTEM

TECHNICAL FIELD

This invention generally relates to methods and apparatus for diagnosing faults within, and otherwise determining the particular condition of the components and devices comprising, the electrical system of a motor vehicle. More specifically, this invention relates to methods and apparatus for diagnosing the presence and location of any faults within the vehicle's electrical system to facilitate the diagnosis and servicing of such faults more quickly and at reduced cost.

BACKGROUND OF THE INVENTION

The electrical systems of today's vehicle's are becoming increasingly complex as engineers replace various passive subsystems with so-called active or "smart" subsystems featuring their own logic and control functions. Such smart subsystems may control, for example, the vehicle's antilock brakes and automatic transmission, as well as a variety of subsystems which may be generally referred to as "body circuits." As a result, the electrical system of the typical vehicle includes increasing numbers of discrete, though highly-interconnected, electrical components and logic devices, with a correlative increase in the difficulty with which faults or failures in any one or more of those components and/or logic devices may be successfully and readily diagnosed.

For example, rather than having a simple wiring harness comprising a bundle of dedicated wires through which individualized control signals for each component might be sent from a central processor or Electronic Control Module ("ECM"), the logic of many components is now further responsive to a variety of analog and/or digital signals correlatively generated by any number of other counterpart components within the system. With this high degree of component interaction, the identify of the malfunctioning component becomes much less apparent, and "troubleshooting" a vehicle having a faulty electrical system becomes an increasingly difficult and time-consuming task. And, troubleshooting of these electrical systems is further complicated upon experiencing a short otherwise preventing the powering-up of all or part of the system.

Moreover, the electrical interaction of the various components and devices comprising the vehicle's electrical system is directly affected, not only by the vehicle make and model, but by the particular manner in which that very vehicle is outfitted. This in turn produces variation in the nominal characteristics of the vehicle's electrical system, even when the system is known to be operating in accordance with specifications. Such "normal" variation in the system's characteristics makes the diagnosis of later-occurring faults much more problematic.

Finally, known apparatus and methods for diagnosing faults in vehicle electrical systems also have difficulty addressing the somewhat related problem of intermittent electrical system malfunction due, for example, to the presence of marginal components therein, either as of the time of vehicle manufacture or later, upon deterioration or aging of those components. Add to this the desire to reduce customer inconvenience and warranty expense through preventive maintenance, likewise requiring, for example, identification of such marginal components for replacement or service when the customer brings the vehicle in for regularly-scheduled maintenance.

What is needed, then, is an apparatus and method for diagnosing faults within a vehicle's electrical system which overcomes the aforesaid problems encountered by the prior art.

SUMMARY OF THE INVENTION

An object of the invention is to provide an apparatus and method for diagnosing the presence and location of faults within a vehicle's electrical system notwithstanding a high degree of component and subsystem interconnection therein.

Another object of the invention is to provide an apparatus and method for diagnosing faults within a vehicle's electrical system featuring the ability to troubleshoot the electrical system in a qualitative mode.

A further object of the invention is to provide an apparatus and method for diagnosing faults within a vehicle's electrical system having the ability to troubleshoot the electrical system or a subsystem thereof notwithstanding the presence of a short therein.

Yet another object of the invention is to provide an apparatus and method for diagnosing faults within a vehicle's electrical system capable of diagnosing intermittent problems through identification of marginal components.

Yet another object of the invention is to provide an apparatus and method for diagnosing faults within a vehicle's electrical system which facilitates preventative maintenance through the detecting of developing flaws which might ultimately result in premature component/system failure.

Yet another object of the invention is to provide an apparatus and method for diagnosing faults within a vehicle's electrical system featuring ease of connection to the vehicle.

Under the present invention, an apparatus for diagnosing the presence and location of faults within a vehicle's electrical system includes a first signal generator for generating an a.c. test signal, such as a sinewave of known frequency and amplitude; a switching means, connected to a plurality of electrical leads to components of the vehicle's electrical system at an interface between the system's ECU and those components, for selectively and sequentially applying the a.c. test signal to each of electrical lead; and a first detector connected to one other electrical lead, such as the system's common ground, not otherwise connected to the switching means. The first detector detects the system's response to application of the a.c. test signals to the electrical leads, thereby obtaining a set of transitory electrical characteristics the vehicle's electrical system.

The apparatus of the invention further includes a storage means for providing a set of reference characteristics for the vehicle's electrical system; a comparator means for comparing the detected transitory characteristics with the stored set of reference characteristics; and a diagnostic processor means responsive to the comparator means for diagnosing the presence of a fault when the detected transitory characteristics of the vehicle's electrical system deviate significantly from the stored set of reference characteristics therefor.

Upon diagnosing the presence of a fault within the vehicle's electrical system, a second signal generator controlled by the diagnostic processor injects a d.c. test signal through the switching means only into the lead or leads of the interface deemed responsible for the deviant system output. A second detector means connected by the switching means only to the lead into which a given d.c. test signal is injected detects the reflection of the d.c. test signal. The time lapse between injection of the d.c. test signal and detection of its reflection, along with the magnitude of the reflected signal, is thereafter used by the diagnostic processor to identify the relative distance of any existing fault from the interface to facilitate subsequent servicing of the vehicle's electrical system.

BRIEF DESCRIPTION OF THE DRAWING

The drawing is a diagram of a preferred apparatus for diagnosing the presence and location of one or more faults within the electrical system of a vehicle in accordance with the invention.

DETAILED DESCRIPTION OF THE PREFERRED EMBODIMENT

Referring to the drawing, and in accordance with the invention, an apparatus 10 is shown for diagnosing the presence and location of one or more faults within the electrical system 12 of a motor vehicle (not shown). The electrical system 12 itself includes a system control unit, commonly referred to as its ECU 14, which is connected through an interface 16 to a plurality of interconnected electrical components 18. The interface 16 thus includes a plurality of electrical leads 20 connected between the ECU 14 and the components 18. In the preferred embodiment, one of these leads constitutes a common ground 22.

In accordance with the invention, the apparatus 10 for diagnosing faults within the above electrical system 12 includes a first signal generator 24 for generating an a.c. test signal, such as a sinewave of known frequency and amplitude, to be used during the first phase of system diagnosis. A switching means 26 comprising a network of individually-selectable switches interconnects the first signal generator 24 with the individual electrical leads 20 in the interface 16. The switching means 26 operates under the control of a processor 34 to apply the a.c. test signal generated by the first signal generator 24 in a known sequence to each of the electrical leads 20 in the interface 16.

A first detector 28 is connected to the common ground 22 at the interface 16. The first detector 28 detects the signal generated at the common ground 22 of the interface 16 in response to application of the a.c. test signal to those leads 20. In this manner, the first detector 28 detects a set of transitory characteristics for the vehicle's electrical system 12. More specifically, this technique—sometimes known as "analog signal analysis," or "ASA"—provides the current (I) versus voltage (V) characteristic for each electrical lead 20 in the interface 16. The resulting set of IV characteristics provides a unique signature for that electrical lead 20 based upon every component 18 interconnected between that lead 20 and the interface's common ground 22. In this manner, the entire vehicle electrical system 12 may be characterized for subsequent comparison with one or more sets of reference characteristics therefor.

Accordingly, under the invention, the diagnostic apparatus 10 further includes a storage means, such as an EPROM 30, which correlatively provides a stored set of reference characteristics for the vehicle's electrical system 12. The set of reference characteristics stored in the EPROM 30 may be a set of ideal or "master" characteristics to provide an objective appraisal of the condition of the vehicle's electrical system 12.

Alternatively, as in the preferred embodiment, the set of reference characteristics stored in the EPROM 30 preferably comprises a set of detected characteristics obtained at an earlier time using the first detector 28, as when the electrical system is known to be operating satisfactorily at time of vehicle manufacture, thereby "personalizing" the stored reference characteristics to that particular vehicle. In this manner, a subjective reference is provided to facilitate detection of subsequent variations in the "signatures" of that very vehicle's electrical system 12. Indeed, in accordance with another feature of the invention, even minor variation from these subjective reference characteristics may be extrapolated so as to predict impending component failure and the attendant need for the servicing of the vehicle.

Returning to the drawing, the present apparatus 10 also includes a comparator 32 for comparing the set of detected transitory characteristics with the stored set of reference characteristics. The processor 34 which controls the switching means 26 is itself responsive to the output of the comparator 32 for diagnosing the presence of at least one fault when the set of transitory characteristics for the vehicle's electrical system 12 deviate significantly from the stored set of reference characteristics. The amount of deviation which is considered significant and, hence, serves to trigger identification of a fault with the present apparatus 10 may be empirically established for the electrical system 12 of a given vehicle in a manner known to those skilled in the art.

In accordance with another feature of the present invention, the apparatus 10 as seen in the drawing further includes a second signal generator 36 responsive to the diagnostic processor 34 for generating a d.c. test signal of known magnitude and duration. In the preferred embodiment, the switching means 26 also selectively interconnects the second signal generator 36 with each electrical lead 20 at the interface 16. Thus, the switching means 26 likewise operates under the control of the diagnostic processor 34 to sequentially inject the d.c. test signal from the second signal generator 36 only into those electrical leads 20 associated with the diagnosed fault. A second detector 40, also interconnected with selected electrical leads 20 at the interface 16, then detects the resulting reflection of the d.c. test signal only in those selected electrical leads 20.

As should be appreciated by those familiar with "time-domain reflectometry," the reflection of the d.c. test signal is nominally caused by an impedance anomaly located somewhere between the electric lead 20 at the interface 16 and the component(s) 18 connected therewith. The diagnostic processor 34 is responsive to the output of the second detector 40 so as to diagnose the location of the fault within the vehicle's electrical system 12 based on the time lapse between injection of the d.c. test signal into the subject electrical lead 20 and detection of the reflection of the d.c. test signal therein.

In accordance with another feature of the invention, the apparatus 10 of the invention is preferably used at the time of vehicle manufacture to quickly confirm that its electrical system 12 as manufactured conforms to design parameters. This provides increased vehicle reliability which, in turn, can greatly reduce warranty costs. And, as noted hereinabove, once the first detected set of characteristics is deemed to fall within design parameters, that very set of reference characteristics may themselves be stored in the EPROM 30 so that later-occurring variation in that very vehicle's electrical system may be tracked using the invention in the manner described above. A complete snapshot of that particular vehicle's electrical system 12 can thus be shipped with the vehicle to facilitate diagnosis and subsequent repair of any later-occurring faults.

While the preferred embodiment of the invention has been disclosed, it should be appreciated that the invention is susceptible of modification without departing from the spirit of the invention or the scope of the subjoined claims. For example, while the preferred embodiment described hereinabove illustrates an apparatus 10 in accordance with the invention as being discrete from the vehicle's electrical system 12 upon which it is used, it should be appreciated that the apparatus 10 may itself be integrated into the vehicle's electrical system 12 to provide on-board self diagnosis. Similarly, while the lead 22 to which the first detector 28 in the preferred embodiment is connected is common ground, it should be appreciated that the invention merely requires a reference point within the vehicle's electrical system for generating a set of characteristics relative to that point.

We claim:

1. An apparatus for diagnosing a fault within the electrical system of a vehicle, said electrical system including a system control unit connected to a plurality of electrical components through an interface, said interface including a plurality of electrical leads connected to said components, said apparatus comprising:

a first signal generator for generating an a.c. test signal;

a switching means coupled to the first signal generator and to the interface for sequentially applying said a.c. test signal to the electrical leads except for an electrical lead connected to a common of the electrical system to generate a system output at the common;

a first detector means connected to the electrical lead connected to the common for detecting a set of transitory characteristics of the vehicle electrical system based on the response of said vehicle electrical system to the application of said a.c. test signal to the electrical leads;

a storage means for providing a stored set of reference characteristics for said vehicle electrical system;

a comparator means for comparing the detected transitory characteristics with the stored set of reference characteristics; and a processor means responsive to said comparator means for diagnosing the presence of at least one fault when the detected transitory characteristics of the vehicle electrical system deviate significantly from the stored set of reference characteristics for said vehicle electrical system.

2. The apparatus of claim 1, wherein said a.c. test signal is a sinewave of known frequency and amplitude.

3. The apparatus of claim 1, wherein the common of the electrical system is a common ground of the electrical system.

4. The apparatus of claim 1, wherein said set of reference characteristics for said vehicle electrical system is an initial set of detected transitory characteristics for said vehicle electrical system obtained when said vehicle electrical system is known to be operating satisfactorily.

5. The apparatus of claim 4, wherein said initial set of detected transitory characteristics is obtained at the time of vehicle manufacture.

6. The apparatus of claim 1, further including:

a second signal generator coupled to the switching means and responsive to said processor means for generating a d.c. test signal of known magnitude and duration;

the switching means further responsive to said processor means for selectively injecting said d.c. test signal into one of the electrical leads of said interface associated with said diagnosed fault; and a second detecting means coupled to said electrical lead connected to said common or said electrical system and responsive to said processor means for detecting the reflection of said d.c. test signal in said one of the electrical leads, respectively, and wherein said processor means diagnoses the location of said fault within said vehicle electrical system based on the time period between the injection of said d.c. test signal into said one of the electrical leads and the detection of the reflection of said d.c. test signal therein.

7. A method for diagnosing a fault within the electrical system of a vehicle, said electrical system including a system control unit connected to a plurality of electrical components through an interface, said interface including a plurality of electrical leads connected to said components, said method including the steps of:

sequentially applying an a.c. test signal to the electrical leads except for an electrical lead connected to a common ground of the electrical system to generate a system output at the common ground;

detecting the system output responsive to said application step at the electrical lead connected to the vehicle common ground to obtain a set of transitory characteristics of said vehicle electrical system;

providing a stored set of reference characteristics for said vehicle electrical system;

comparing the set of transitory characteristics with the stored set of reference characteristics and diagnosing the presence of at least one fault when the set of transitory characteristics of the vehicle electrical system deviate significantly from the stored set of reference characteristics for said vehicle electrical system.

8. The method of claim 7, wherein said a.c. test signal is a sine wave of known frequency and amplitude.

9. The method of claim 7, wherein said step of providing the set of reference characteristics for said vehicle electrical system includes the steps of:

detecting the set of transitory characteristics at a first time when said vehicle electrical system is known to be operating satisfactorily; and storing the set of transitory characteristics detected at said first time in a storage means.

10. The method of claim 9, wherein the first time at which said detecting step is performed is at the time of vehicle manufacture.

11. The method of claim 7, additionally comprising the steps of:

generating a d.c. test signal of known magnitude and duration;

injecting said d.c. test signal into one of the electrical leads of said vehicle electrical system associated with said diagnosed fault;

detecting the reflection of said d.c. test signal in said one of the electrical leads; and diagnosing the location of said fault within said vehicle electrical system based on the amount of time passing between said injecting step and said reflection detecting step.

12. The method of claim 7, further comprising the step of predicting the future occurrence of a given fault based on said comparing step.

* * * * *